US008115558B2

(12) United States Patent
Tsuda et al.

(10) Patent No.: US 8,115,558 B2
(45) Date of Patent: Feb. 14, 2012

(54) DIGITAL PLL CIRCUIT AND SEMICONDUCTOR INTEGRATED CIRCUIT

(75) Inventors: Yuki Tsuda, Kanagawa (JP); Hideaki Masuoka, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 22 days.

(21) Appl. No.: 12/726,474

(22) Filed: Mar. 18, 2010

(65) Prior Publication Data

US 2010/0265001 A1    Oct. 21, 2010

(30) Foreign Application Priority Data

Apr. 17, 2009    (JP) ................................. 2009-101210

(51) Int. Cl.
*H03L 7/099*  (2006.01)
*H03L 7/087*  (2006.01)
*H03B 5/12*   (2006.01)
*H03C 3/22*   (2006.01)

(52) U.S. Cl. .................... 331/36 C; 331/11; 331/117 R; 331/177 V; 375/375

(58) Field of Classification Search .................... 331/11, 331/16, 17, 25, 36 C, 117 FE, 117 R, 167, 331/177 V; 375/375
See application file for complete search history.

(56) References Cited

U.S. PATENT DOCUMENTS

| 6,137,372 | A  | * | 10/2000 | Welland | 331/117 R |
| 6,993,314 | B2 | * | 1/2006 | Lim et al. | 455/333 |
| 7,199,698 | B1 | * | 4/2007 | Goldfarb | 331/177 V |
| 7,432,768 | B2 | * | 10/2008 | Han et al. | 331/16 |
| 7,528,665 | B2 | * | 5/2009 | Coppola et al. | 331/2 |
| 7,808,288 | B2 | * | 10/2010 | Chatterjee | 327/156 |
| 7,812,678 | B2 | * | 10/2010 | Moussavi | 331/25 |

FOREIGN PATENT DOCUMENTS

| JP | 2003110424 | 4/2003 |
| JP | 2004159222 | 6/2004 |
| JP | 2006135892 | 5/2006 |
| JP | 2007067635 | 3/2007 |

* cited by examiner

*Primary Examiner* — Levi Gannon
(74) *Attorney, Agent, or Firm* — Turocy & Watson, LLP (57) ABSTRACT

A digital PLL circuit includes: an oscillation circuit, wherein an oscillation frequency is controlled by changing the number of capacitance elements to be connected in parallel to an inductance element; and a phase comparator part configured to perform a digital phase comparison of a reference clock and a delayed clock thereof, with an oscillation circuit output; and based on the comparison result, to control the number of the capacitance elements so as to bring the phase of the oscillation circuit output closer to the reference clock phase, wherein the capacitance element includes: a coarse adjustment capacitor configured to have a predetermined capacitance; and fine adjustment capacitors configured to have a capacitance of 1/n of that of the coarse adjustment capacitor, wherein a predetermined number of the fine adjustment capacitors function as one coarse adjustment capacitor at the time of coarse adjustment.

5 Claims, 10 Drawing Sheets

PRIOR ART

FIG.11B

PRIOR ART

FIG. 12

DIGITAL PLL CIRCUIT AND SEMICONDUCTOR INTEGRATED CIRCUIT

CROSS-REFERENCE TO RELATED APPLICATIONS

This application is based upon and claims the benefit of priority from the prior Japanese Patent Application No. 2009-101210 filed in Japan on Apr. 17, 2009; the entire contents of which are incorporated herein by reference.

BACKGROUND OF THE INVENTION

1. Field of the Invention

The present invention relates to a digital PLL circuit which performs the adjustment of the oscillation frequency of a voltage-controlled oscillator constituting a PLL circuit by switching the capacitors in the voltage-controlled oscillator, and to a semiconductor integrated circuit incorporating the digital PLL circuit.

2. Description of the Related Art

There is a technology which allows reducing lock-up time and lowering sensitivity of frequency adjustment of a PLL circuit by bringing the oscillation frequency of a voltage-controlled oscillator (hereafter referred to as a VCO) closer to a desired frequency in advance by use of a tuning capacitor besides a variable capacity capacitor in the resonance circuit of the VCO.

In such a PLL circuit, since control is performed using a large number of tuning capacitors in the resonance circuit, selector switches of the same number as that of the capacitors are necessary. To get rid of such inconvenience, there is a method to reduce the numbers of capacitors and selector switches to be controlled by using two kinds of capacitors of different sizes, that is, capacitances and controlling them respectively in two times. Typically, the control is performed in the sequence from a coarse adjustment to a fine adjustment with the control by a capacitor with a larger capacitance being as a coarse adjustment interval and the control by a capacitor with a smaller capacitance being as a fine adjustment interval.

The frequency variable range of a VCO is determined by the capacitance of the tuning capacitor, and when an attempt is made to perform a control beyond the frequency variable range, a cycle slip will take place, thereby resulting in a malfunction. In the control using one kind of capacitor, since a malfunction is caused by an attempt to select an uncontrollable frequency range in actual operation, no problem will arise. However, when a two-step control is performed using two kinds of capacitors, a cycle slip will take place for each capacitor. Although there is no problem with a cycle slip which takes place in a fine adjustment interval because it is caused as a result of an uncontrollable frequency being set, a cycle slip in a coarse adjustment interval, which is performed before fine adjustment, will pose a problem in that the cycle slip will affect the control in the following fine adjustment interval. As a result, a cycle slip which takes in a coarse adjustment interval will cause a problem in that it decreases the frequency variable range of the voltage-controlled oscillator.

Note that regarding the control of oscillation frequency of a VCO in a PLL circuit, technologies such as those described in the following Patent Documents are disclosed.

Japanese Patent Application Laid-Open Publication No. 2006-135892 describes that a plurality of variable capacitance capacitors which are used in a resonance circuit of VCO are adjusted by one operation with a logically combined output.

Japanese Patent Application Laid-Open Publication No. 2007-67635 describes that the oscillation frequency of a VCO is adjusted by separating two lines of capacitances: a group of variable capacitance elements for frequency selection, and a group of variable capacitance elements for variation adjustment.

Japanese Patent Application Laid-Open Publication No. 2004-159222 describes that the oscillation frequency of a VCO is adjusted by a combination of capacitance elements arranged in parallel, each of which has a capacitance value, for example, magnified by a factor of n-th power of 2.

However, none of Patent Documents of Japanese Patent Application Laid-Open Publication Nos. 2006-135892, 2007-67635, 2004-159222 addresses the adjustment by switching between capacitors with different sizes for fine and coarse adjustment, nor can solve the above described problems due to a cycle slip when a two-step control is performed.

BRIEF SUMMARY OF THE INVENTION

According to one aspect of the present invention, there is provided a digital PLL circuit, comprising:

an oscillation circuit configured to include an inductance element L and a capacitance element C, and to oscillate at a frequency in accordance with an LC value, wherein an oscillation frequency is controlled by changing the number of the capacitance element to be connected in parallel to the inductance element; and a phase comparator part configured to detect an amount of a phase lead or lag of an output of the oscillation circuit by performing a digital phase comparison of a reference clock and a delayed clock which is successively delayed by a predetermined unit time from the reference clock, with an oscillation output of the oscillation circuit, and based on a detected amount of the phase lead or lag, to control the number of parallel connection of the capacitance element thereby controlling the oscillation frequency of the oscillation circuit so as to bring the phase of the output of the oscillation circuit closer to the phase of the reference clock, wherein the oscillation circuit comprises:

at least one selector-switch-equipped coarse adjustment capacitor, configured to have a predetermined capacitance and to be connectable in parallel to the inductance element; and a plurality of selector-switch-equipped fine adjustment capacitors, configured to be connectable in parallel to the selector-switch-equipped coarse adjustment capacitor, wherein each of the plurality of fine adjustment capacitors has a capacitance of 1/n (n is a positive integer) of the capacitance of the coarse adjustment capacitor, and wherein at the time of coarse adjustment, a predetermined number of selector-switch-equipped fine adjustment capacitors of the plurality of selector-switch-equipped fine adjustment capacitors are connected in parallel so as to be controllable as one coarse adjustment capacitor; and at the time of fine adjustment, the plurality of selector-switch-equipped fine adjustment capacitors are individually connected in parallel by use of the selector switches thereof in accordance with the adjustment amount of the oscillation frequency of the oscillation circuit.

According to another aspect of the present invention, there is provided a semiconductor integrated circuit, comprising:

a digital PLL circuit, comprising:

an oscillation circuit configured to include an inductance element L and a capacitance element C, and to oscillate at a frequency in accordance with a LC value, wherein an oscillation frequency is controlled by changing the number of the capacitance element to be connected in parallel to the inductance element; and a phase comparator part configured to detect an amount of a phase lead or lag of an output of the oscillation circuit by performing a digital phase comparison of a reference clock and a delayed clock which is successively delayed by a predetermined unit time from the reference clock, with an oscillation output of the oscillation circuit, and based on a detected amount of the phase lead or lag, to control the number of parallel connection of the capacitance element to control the oscillation frequency of the oscillation circuit so as to bring the phase of the output of the oscillation circuit closer to the phase of the reference clock, wherein the oscillation circuit comprises: at least one selector-switch-equipped coarse adjustment capacitor, configured to have a predetermined capacitance, and to be connectable in parallel to the inductance element; and a plurality of selector-switch-equipped fine adjustment capacitors, configured to be connectable in parallel to the selector-switch-equipped coarse adjustment capacitor, wherein each of the plurality of fine adjustment capacitors has a capacitance of 1/n (n is a positive integer) of the capacitance of the coarse adjustment capacitor, and wherein at the time of coarse adjustment, a predetermined number of selector-switch-equipped fine adjustment capacitors of the plurality of selector-switch-equipped fine adjustment capacitors are connected in parallel so as to be controllable as one coarse adjustment capacitor; and at the time of fine adjustment, the plurality of selector-switch-equipped fine adjustment capacitors are individually connected in parallel by use of the selector switches thereof in accordance with the adjustment amount of the oscillation frequency of the oscillation circuit;

an analog PLL circuit, comprising:

a variable capacitance element configured to be connected in parallel to the inductance element of the oscillation circuit; and a second phase comparator part configured to perform an analog phase comparison between the oscillation output of the oscillation circuit and the reference clock, and to control the oscillation frequency of the oscillation circuit such that the phase of the oscillation output of the oscillation circuit coincides with the phase of the reference clock; and change-over means configured to perform a changeover to the analog PLL circuit after the digital PLL circuit is locked up at a frequency of a predetermined initial value.

BRIEF DESCRIPTION OF THE DRAWINGS

FIGS. 8A and 8B are diagrams to illustrate the control operation of the tuning capacitor of FIG. 7, in which

FIGS. 11A and 11B are diagrams to illustrate the control operation of the tuning capacitor of FIG. 10, in which

DETAILED DESCRIPTION OF THE INVENTION

Hereafter, an embodiment of the present invention will be described in detail with reference to the drawings.

A semiconductor integrated circuit 10 of an embodiment of the present invention includes two PLL circuits made up of an analog PLL circuit and a digital PLL circuit.

Figure 1:
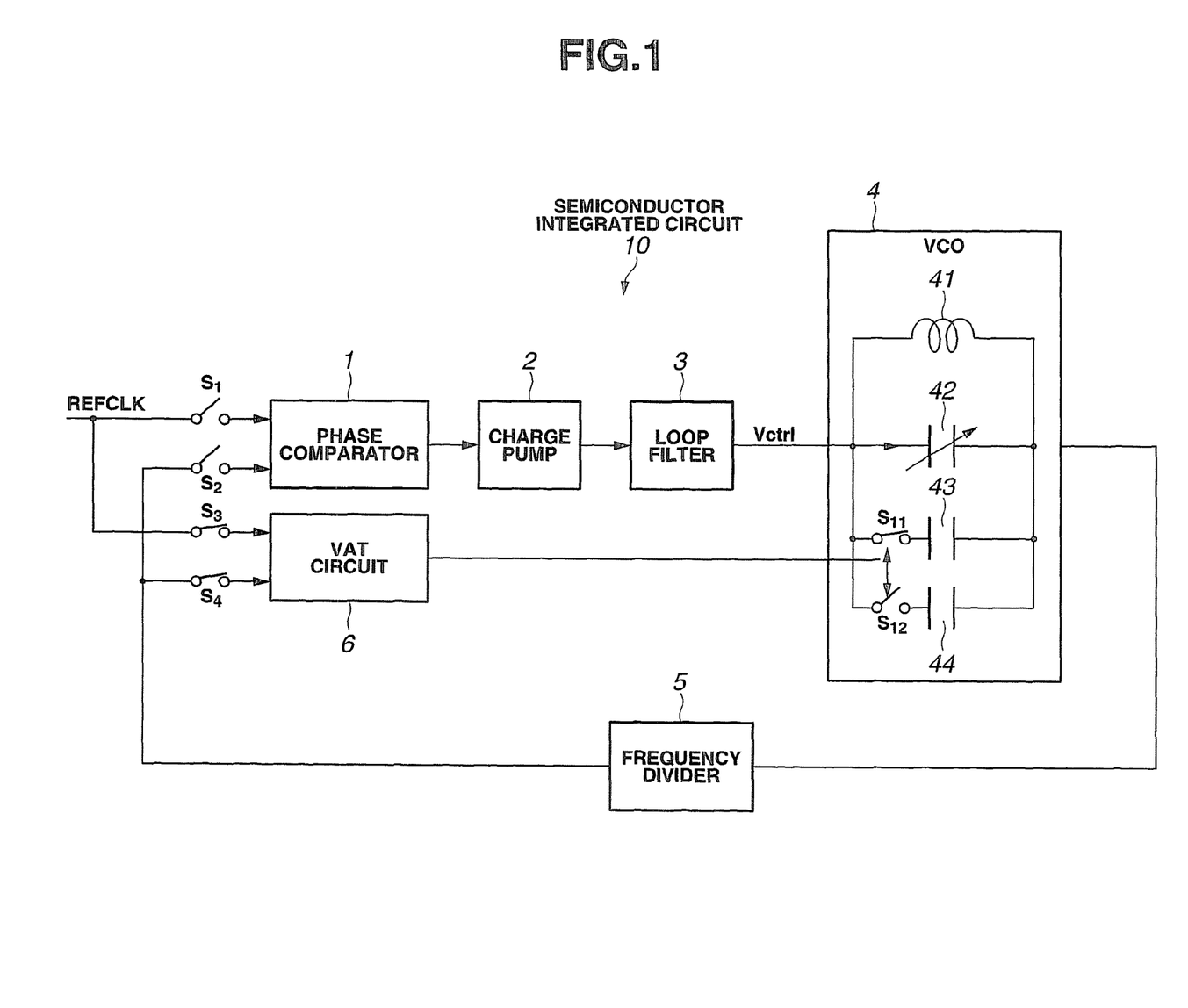
FIG. 1 is a circuit diagram to show the configuration of a semiconductor integrated circuit of an embodiment of the present invention.

The analog PLL circuit includes a phase comparator 1 which functions as an analog phase comparator which is a first phase comparator part, a charge pump 2, a loop filter 3, a VCO 4 as an oscillation circuit, a frequency divider 5, and analog PLL circuit change-over switches S1 and S2. The analog PLL circuit change-over switches S1 and S2 are connected (turned on) when the analog PLL circuit is in use and is disconnected (turned off) when the analog PLL circuit is not in use.

The digital PLL circuit includes a VCO 4, a frequency divider 5, a VCO auto-tuning circuit (hereafter, referred to as a VAT circuit) 6 which functions as a digital phase comparator which is a second phase comparator part, and digital PLL circuit change-over switches S3 and S4. The digital PLL circuit change-over switches S3 and S4 are connected (turned on) when the digital PLL circuit is in use and is disconnected (turned off) when the digital PLL circuit is not in use.

A set of the analog PLL circuit change-over switches S1 and S2 and a set of the digital PLL circuit change-over switches S3 and S4 are on/off controlled by a control part which is not shown or a VAT circuit 6. After the power is turned on, first, the set of the digital PLL circuit change-over switches S3 and S4 are turned on so that the digital PLL circuit operates. When the digital PLL circuit is locked up, the set of the analog PLL circuit change-over switches S1 and S2 are turned on at the same time when the set of the digital PLL circuit change-over switches S3 and S4 are turned off, so that the analog PLL circuit operates.

The VCO 4 includes an inductance element 41, a variable capacitance capacitor 42 connected in parallel to the inductance element 41, and two kinds of tuning capacitors 43 and 44 for fining and coarse adjustment.

The variable capacitance capacitor 42 and the tuning capacitors 43 and 44 make up a capacitance element.

The VCO 4 includes an LC parallel resonance circuit made up of the inductance element 41 and the variable capacitance capacitor 42. Further, to this LC parallel resonance circuit, a coarse adjustment capacitor 43 with a selector switch S11 for tuning is connected in parallel, and also a fine adjustment capacitor 44 with a selector switch S12 for tuning is connected in parallel. The selector switches S11 and S12 are connected in series to the coarse adjustment capacitor 43 and the fine adjustment capacitor 44, respectively, so that turning on the selector switches S11 and S12 will bring the coarse adjustment capacitor 43 and the fine adjustment capacitor 44 into electrical connection in parallel to the LC parallel resonance circuit. The selector switches S11 and S12 are made up of, for example, a switching transistor.

The VAT circuit 6 has a function to detect an amount of a phase lead or lag of an output of the VCO 4 by performing a digital phase comparison of a reference clock REFCLK and a delayed clock which is successively delayed by a predetermined unit time from the reference clock, with an oscillation output of the VCO 4, and based on the detected amount, to control the number of parallel connection of the tuning capacitors 43 and 44 thereby controlling the oscillation frequency of the VCO 4 so as to bring the phase of the output of the VCO 4 closer to the phase of the reference clock.

The phase comparator 1 has a function to perform an analog phase comparison between the oscillation output of the VCO 4 and the reference clock REFCLK and, based on the comparison result, to control the variable capacitance element 42 thereby controlling the oscillation frequency of the VCO 4 such that the phase of the oscillation output of the VCO 4 coincides with the phase of the reference clock.

Figure 2:
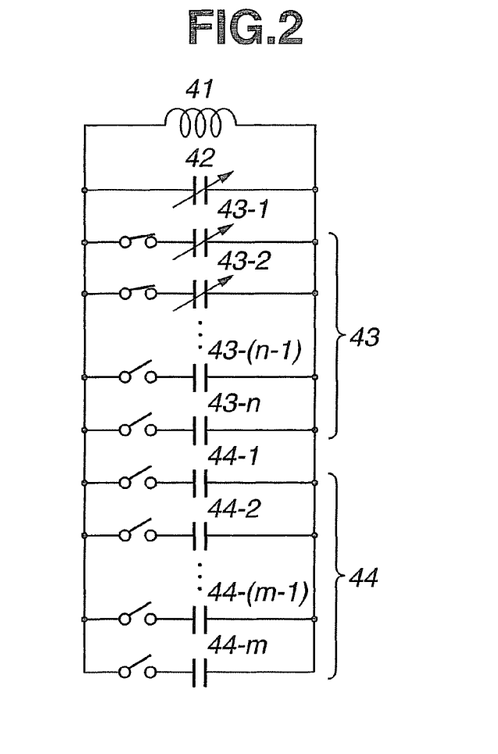
FIG. 2 is a circuit diagram to show an example of the parallel resonance circuit of a VCO in FIG. 1.

Note that although only one capacitor is illustrated in FIG. 1 as the coarse adjustment capacitor 43 for the sake of simplicity, in reality, the coarse adjustment capacitor 43 is made up of a plurality of, for example, about 20 to 40 pieces of selector-switch-equipped capacitors 43-1 to 43-n which are connected in parallel as shown in FIG. 2 and turning on each selector switch brings an appropriate number of capacitors into electrical connection in parallel with the resonance circuit. Similarly, although only one capacitor is illustrated for the fine adjustment capacitor 44, in reality, the fine adjustment capacitor 44 is made up of a plurality of, for example, about 20 to 40 pieces of selector-switch-equipped capacitors 44-1 to 44-m which are connected in parallel as shown in FIG. 2 and turning on each selector switch brings an appropriate number of capacitors into electrical connection in parallel with the resonance circuit.

Note that the states of the switches S1 to S4, and S11 and S12 shown in FIG. 1 indicate the state in which the switches S3 and S4 are turned on so that the digital PLL circuit is in operation, and the coarse adjustment capacitor 43 is turned on so that adjustment is performed.

The control of selecting the number of necessary capacitors for each of the coarse adjustment capacitor group 43 and the fine adjustment capacitor group 44 through the selector switch group S11 and the selector switch group S12 for tuning is performed by, for example, the VAT circuit 6.

Next, the operation of FIG. 1 will be described.

In FIG. 1, although a desired oscillation frequency is eventually generated by controlling the VCO 4 with the analog PLL circuit, it is arranged such that when the power is turned on, first, the VCO 4 is controlled with the digital PLL circuit so as to bring the oscillation frequency closer to a desired oscillation frequency in advance, and when the oscillation frequency comes close to the desired oscillation frequency, the digital PLL circuit is taken over by the analog PLL circuit so that the oscillation frequency is locked up at the desired oscillation frequency by the analog PLL circuit.

The control of the oscillation frequency in the digital PLL circuit operation is such that first, an initial value based on the reference clock REFCLK is provided to the VAT circuit 6 in the VAT circuit 6; a control signal which corresponds to the number of tuning capacitors to be outputted as the phase comparison result from the VAT circuit 6 is provided to the VCO 4; and the control to bring the oscillation frequency closer to the desired oscillation frequency is performed by controlling the on/off of the tuning capacitors 43 and 44. Then, as described above, after the digital PLL circuit is locked up, the control of the oscillation frequency through the analog PLL circuit operation is performed.

The analog phase comparator 1 compares the phases of the frequency division signal, which is obtained by frequency-dividing the oscillation signal of the VCO 4 with the frequency divider 5, and of a highly accurate reference oscillation signal REFCLK from the reference oscillator such as a quartz oscillation circuit not shown and outputs a voltage corresponding to the phase difference (or frequency difference). The charge pump 2 operates in response to the output of the phase comparator 1 in such a way that the capacitance element of a loop filter 3 is charged up or discharged by the charge pump 2; an oscillation control voltage Vctrl of the VCO 4 is generated and supplied to the VCO 4; and the capacitance value of the variable capacitance capacitor 42 is controlled with the control voltage Vctrl so that the VCO 4 is operated to oscillate at a desired predetermined frequency.

In VCOs which are used in semiconductor integrated circuits in recent years, the variable frequency range has grown to a wide frequency range, for example, from 1 GHz to 4 GHz, and the voltage width, which is needed to control such a wide frequency range, has become as small as about 1 V.

Figure 3:
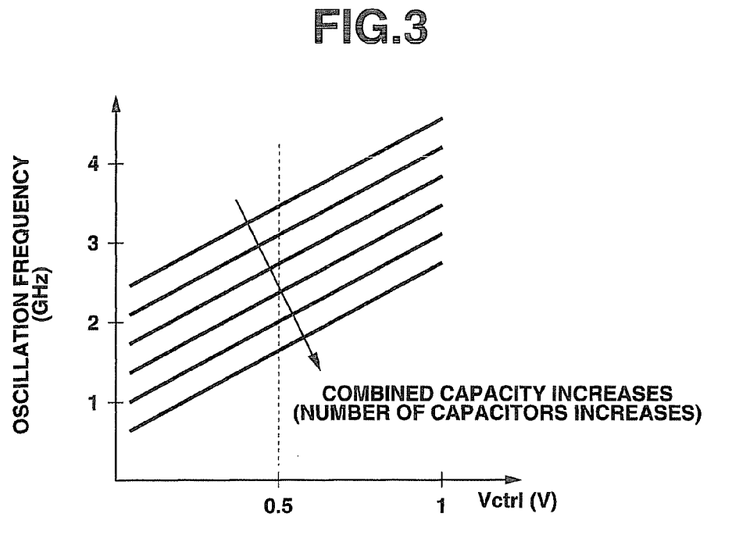
FIG. 3 is a diagram to illustrate a step-wise oscillation control of a digital PLL circuit in FIG. 1.

FIG. 3 shows the input/output characteristics (relation between the control voltage and the oscillation frequency) of a VCO in the digital PLL circuit to be used in the present embodiment. Taking a variable range of the control voltage (Vctrl) in the horizontal axis and a VCO oscillation frequency (GHz) in the vertical axis, and changing the parallel-connection number of capacitors from a small number to a large increased number; a characteristic line showing the oscillation frequency with respect to the control voltage Vctrl is formed every time the parallel-connection number is increased, and stepwise control characteristics are obtained as illustrated. Therefore, it is possible to change the frequency range of the VCO oscillation frequency in a stepwise manner by increasing/decreasing the parallel-connection number of the tuning capacitors at a control voltage within a range of 0 to 1V, for example, of 0.5 V. That is, on the line of Vctrl=0.5 V as shown by a dotted line, it is possible to increase/decrease the oscillation frequency range in a stepwise manner within a range of 0 to 1 V as the voltage control range by changing the parallel-connection number of capacitors at the time of starting the control. Since as the parallel-connection number of capacitors increases, the capacitance C increases, the oscillation frequency of the VCO can be decreased in a stepwise manner within a range of 1 to 4 GHz.

Next, the adjustment of the oscillation frequency of the VCO by the digital PLL circuit will be described.

In the control at the digital PLL circuit, it becomes necessary to determine how many tuning capacitors are to be connected in parallel, and set up the number of the capacitors, which are to be electrically connected (turned on) in the LC resonance circuit within the VCO 4.

In order for that, the amount of a phase lead or lag of the VCO oscillation output with respect to the phase of the reference clock REFCLK is detected, and it is determined how many of the plurality of tuning capacitors including the coarse adjustment capacitors and the fine adjustment capacitors are to be turned on by the respective selector switches, so that the control of oscillation frequency is performed.

The detection of a phase lead or lag of a VCO oscillation pulse with respect to the reference clock REFCLK may be performed in the following manner: the period of the reference clock REFCLK is divided into, for example, 16 equal parts; the 16-division time positions (corresponding to delay-time positions) in one period of the reference clock are numbered No. 1 to No. 16; it is detected to which position of the time positions No. 1 to No. 16 in one period of the reference clock, for example, a rising timing of the VCO oscillation pulse corresponds (in FIG. 5, it corresponds to the position of No. 12); and the oscillation frequency is controlled so as to advance the phase of the VCO oscillation pulse by the amount of that delay time. Specifically, in order to advance the phase of the VCO oscillation pulse, the number of capacitors to be turned on may be controlled so as to increase the oscillation frequency. In order to increase the oscillation frequency of the VCO, the number of capacitors to be turned on may be decreased to increase the frequency of the LC parallel resonance circuit in the VCO. On the contrary, in order to decrease-the oscillation frequency of the VCO, the number of capacitors to be turned on may be increased to decrease the frequency of the LC parallel resonance circuit in the VCO.

Figure 4:
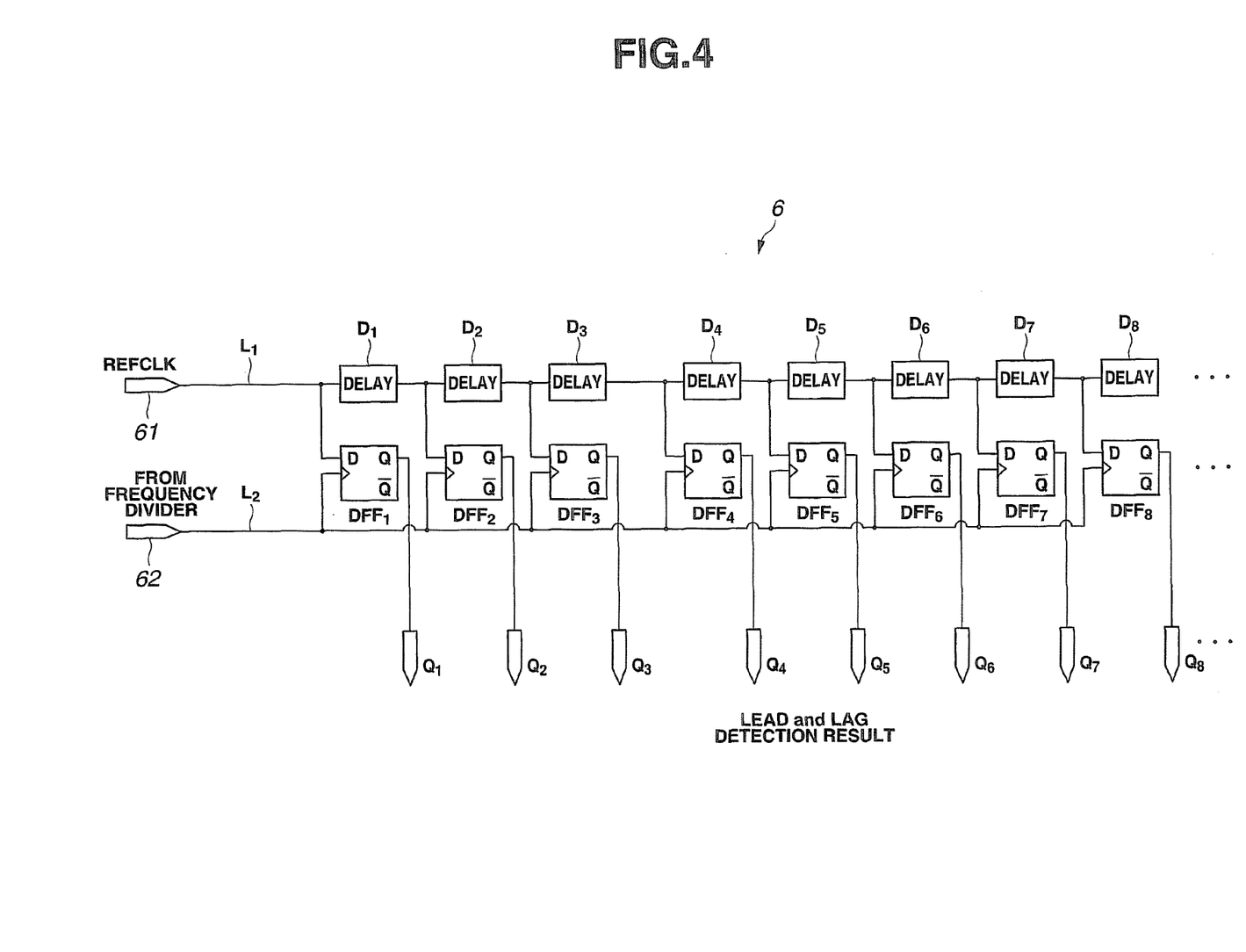
FIG. 4 is a block diagram to show a configuration example of a VAT circuit in FIG. 1.
Figure 5:
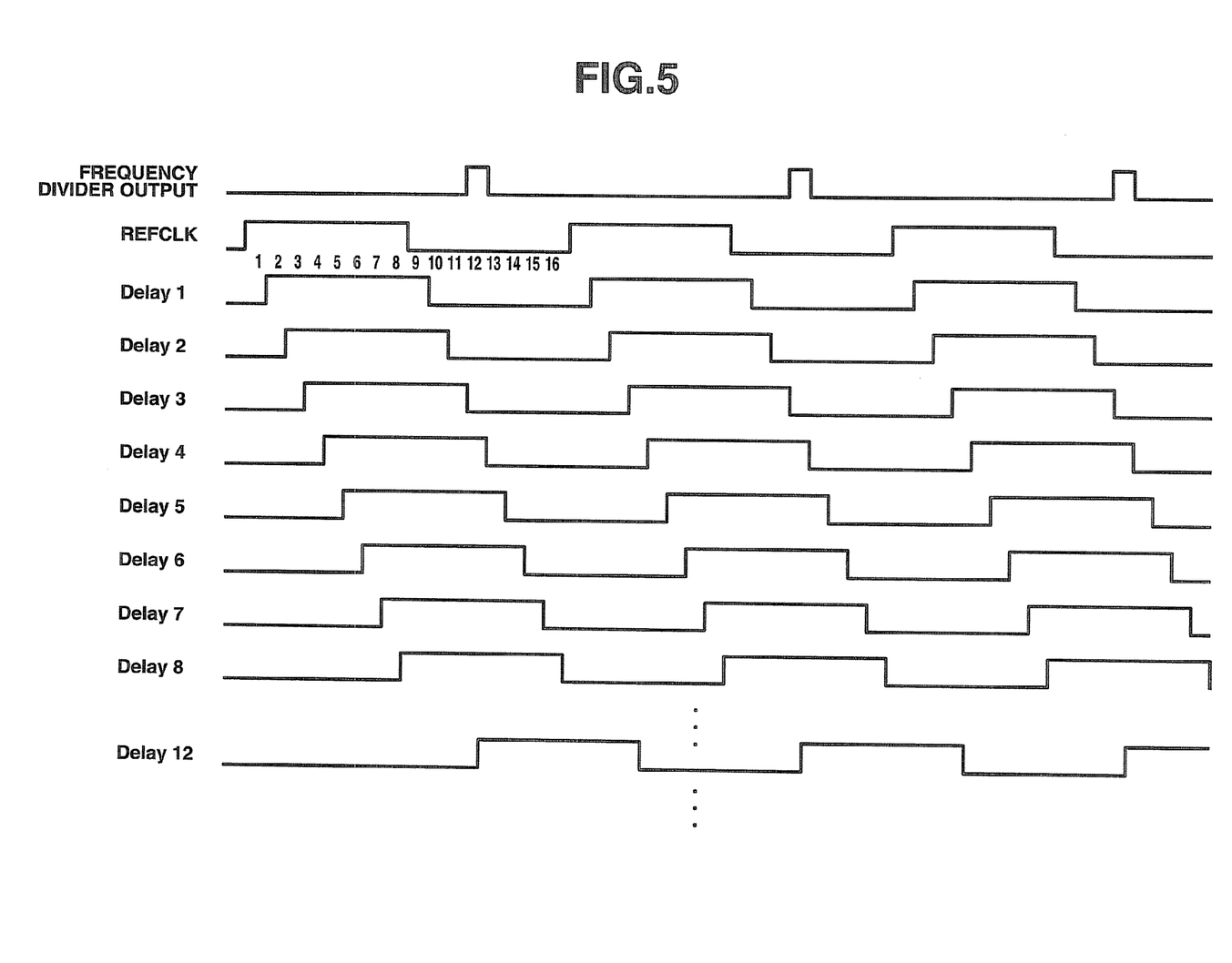
FIG. 5 is a timing chart to illustrate the control method of a VAT circuit of FIG. 4.

FIG. 4 shows an example of the configuration of the VAT circuit, and FIG. 5 shows a timing chart of an example of the phase (or frequency) control of the VCO output by the VAT circuit of FIG. 4.

In the VAT circuit 6 shown in FIG. 4, 16 delay circuits D1 to D16, which correspond to the division number (for example 16) of the interval of one period of the waveform of the reference clock REFCLK, are connected in series. The reference clock REFCLK is inputted to an input terminal 61 for the 16 delay circuits D1 to D16 connected in series, and an oscillation pulse from the VCO 4 (from the frequency divider 5 which frequency-divides the VCO 4 output, in FIG. 4) is inputted to another input terminal 62. Delay 1 to Delay 16 shown in FIG. 5 indicate a delayed clock which is obtained by successively delaying the reference clock REFCLK by a predetermined unit time which is one part of the 16 equally divided parts of the one period of the reference clock REFCLK. Between a series connection line L1 of the 16 delay circuits D1 to D16 which are connected in series to the input terminal 61, and a VCO output line (the output line of the frequency divider, in FIG. 5) L2 connected to the input terminal 62, an input end of each delay terminal D1 to D16 is connected to a D input end of D flip-flops DFF1 to DFF16; and the VCO output line L2 is connected to each clock input end of DFF1 to DFF16. And, it is configured that by detecting whether the signal outputted from each Q output end Q1 to Q16 of 16 DFF1 to DFF16 is of a high level or a low level, it is possible to detect to which of the phase positions No. 1 to No. 16 (see the reference clock REFCLK of FIG. 5) of the reference clock REFCLK, the phase of the rising edge of the VCO oscillation pulse corresponds. For example, by seeing the pattern of the output level of the 16 Q output ends Q1 to Q16 of 16 DFF1 to DFF16; a Q output timing which indicates a change from a high level to a low level can be detected as a delay-time position (delay position 12 in FIG. 5).

If it is detected that the rising position of the VCO oscillation pulse is at the delay-time position No. 12, the VAT circuit 6 performs the control to set up the number of tuning capacitors to be turned on so as to cancel the phase lag amount 12.

Next, if the steps of oscillation frequency (frequency range) are represented by 8 bits, it is possible to represent 256 steps from 0 to 255. If this 256 steps of oscillation frequency is to be implemented by the turning on/off of the tuning capacitors, it is necessary to arrange 256 tuning capacitors in a parallel formation, and to control 256 selector switches so as to be able to cope with 256 steps of oscillation frequencies. This also means that 256 control lines are necessary.

In order to eliminate the need for such large number of control lines, coarse adjustment capacitors having a large capacitance and fine adjustment capacitors having a fraction of the aforementioned capacitance are prepared, and, at, for example, the time of turning of the power, until the frequency is brought close to the target frequency of the frequency steps represented by 8 bits by the control of the VAT circuit 6 of the digital PLL circuit, the necessary number of coarse adjustments and fine adjustment capacitors in accordance with a initial value are turned on in a stepwise manner from a state in which all the tuning capacitors are turned off. At this time, in order to bring the oscillation frequency closer to the target frequency corresponding to an initial value based on the phase difference detection by the digital PLL circuit, besides a predetermined number of coarse adjustment capacitors, a predetermined number of fine adjustment capacitors are turned on, and when the digital PLL circuit is stabilized at a frequency near the target frequency, a changeover to the analog PLL circuit is performed by changing over from a turning-on of the digital PLL circuit change-over switch (S3, S4) to a turning-on of the analog PLL circuit change-over switch. In the analog PLL circuit, in a state in which an on-state of the tuning capacitor in the digital PLL circuit is maintained, the analog PLL circuit operates and the capacitance value of the variable capacitance capacitor 42 in the VCO 4 is continuously varied by the control voltage Vctrl generated by the phase comparison operation of the analog phase comparator 1, so that the VCO oscillation frequency is controlled so as to coincide with the target frequency corresponding to the reference clock REFCLK.

Figure 6:
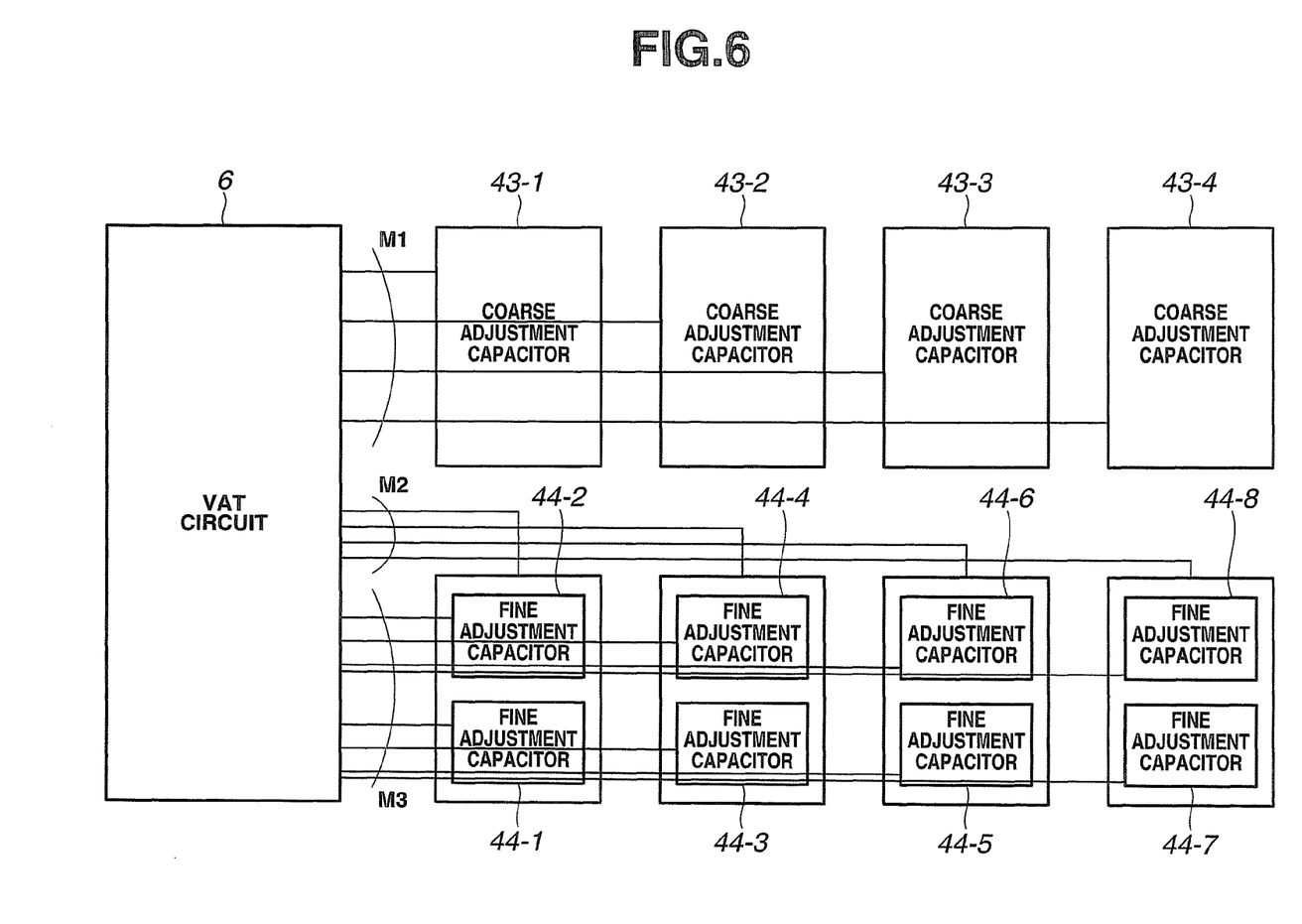
FIG. 6 is a diagram to show an example of the control concept of a tuning capacitor.

FIG. 6 is a diagram to show an example of the control concept of the tuning capacitor.

FIG. 6 shows a case in which the tuning capacitor is made up of, for example, 8 coarse adjustment capacitors and 8 fine adjustment capacitors. The fine adjustment capacitors are controlled as a coarse adjustment capacitor at the time of coarse adjustment as well.

In the present embodiment, the coarse adjustment capacitor is configured to have a size (that is, a capacitance) of n (n is a positive integer) times that of the fine adjustment capacitor and n fine adjustment capacitors are controlled as one coarse adjustment capacitor. Here, a case in which n=8 is shown. Note that any number of the fine adjustment capacitors out of the total number thereof can be controlled as one coarse adjustment capacitor.

The fine adjustment capacitor has a predetermined unit capacitance, for example, 1 fF (femto Farad), and an equivalent to one fine adjustment capacitor (=1 fF) is represented as ×1 size or CAP×1 size. In general, the area of a capacitor is proportional to the capacitor capacitance. If one coarse adjustment capacitor has a capacitance of n (n is a positive integer) times that of the fine adjustment capacitor, for example 8 times (=8 fF), this is represented as ×8 size or CAP×8 size.

In FIG. 6, a reference character M1 indicates four control lines for respectively on/off controlling the four coarse adjustment capacitors 43-1 to 43-4, and a reference character M2 indicates four control lines when eight fine adjustment capacitors 44-1 to 44-8 are used as one coarse adjustment capacitor (or two of the fine adjustment capacitors are used as one coarse adjustment capacitor) at the time of coarse adjustment. Further, a reference character M3 indicates eight control lines for on/off controlling eight fine adjustment capacitors 44-1 to 44-8, respectively at the time of fine adjustment. Note that the reason why the fine adjustment capacitors 44-1 to 44-8 are arranged into sets of two capacitors (44-1, 44-2), (44-3, 44-4), (44-5, 44-6), (44-7, 44-8) is that by treating two fine adjustment capacitors as one set, it is made possible to treat each set as one capacitor of ×2 size (or CAP×2 size) and thereby it is also made possible to separately control each set as a coarse adjustment capacitor, and to decrease the number of the control lines from 8 to 4, which are to be used at the time of coarse adjustment.

Figure 7:
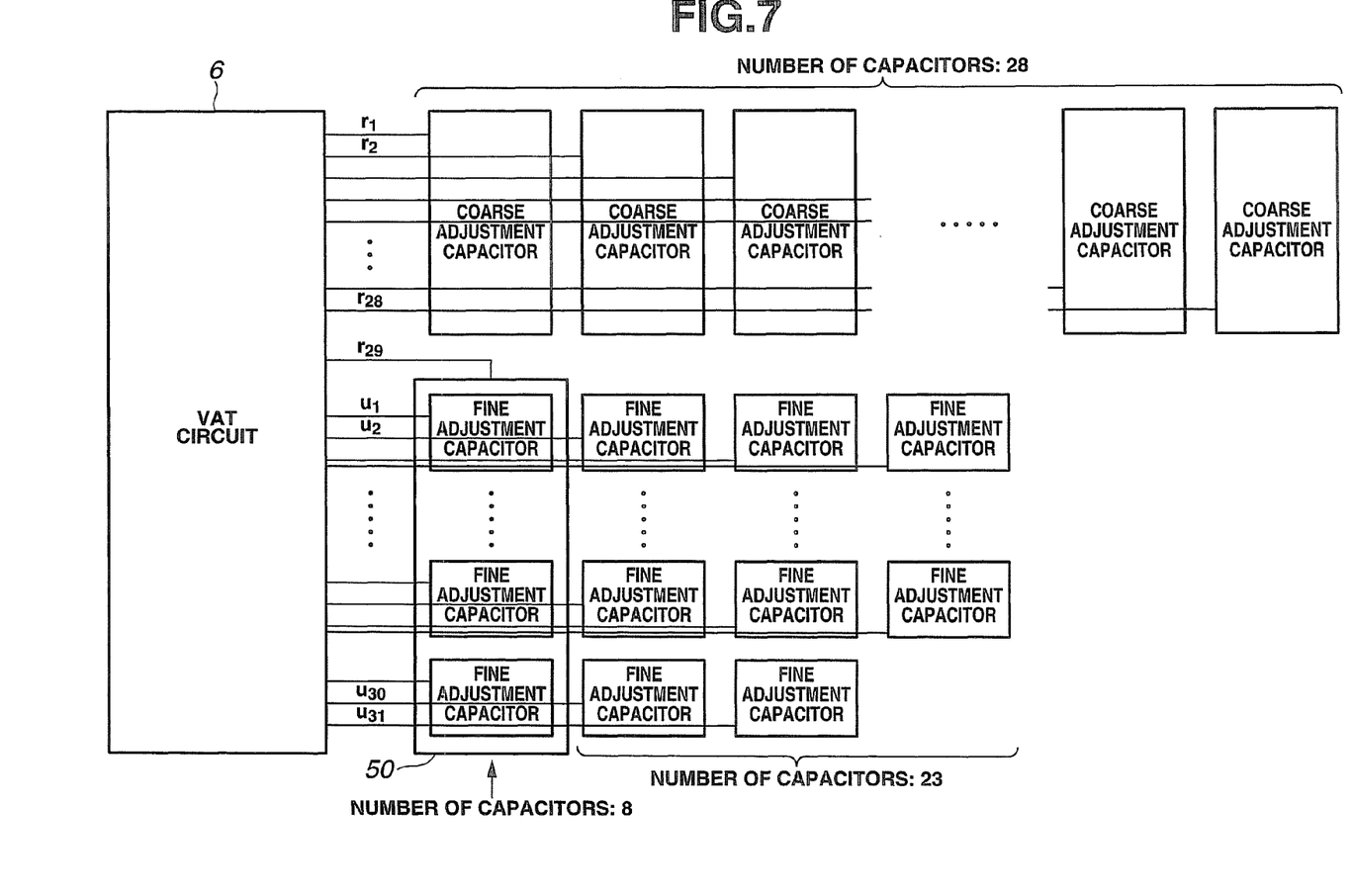
FIG. 7 is a diagram to show another example of the control concept of the tuning capacitor.
Figure 8A:
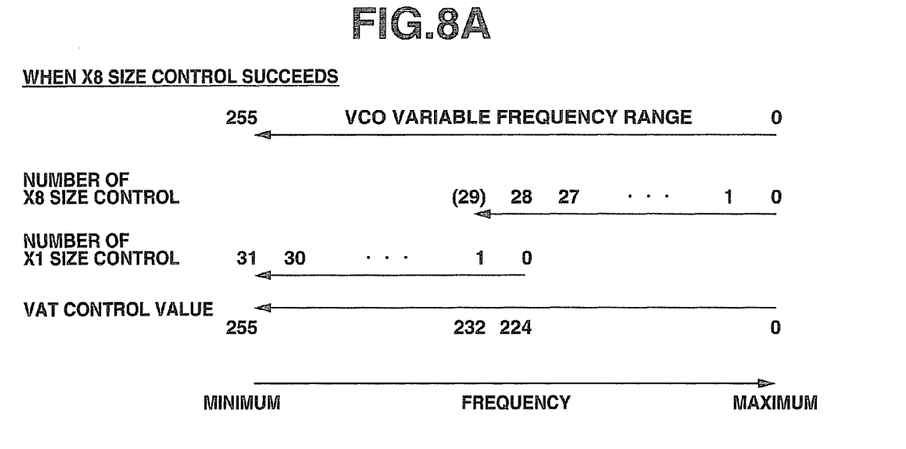
FIG. 8A is a diagram to show the operation when ×8 size control succeeds.
Figure 8B:
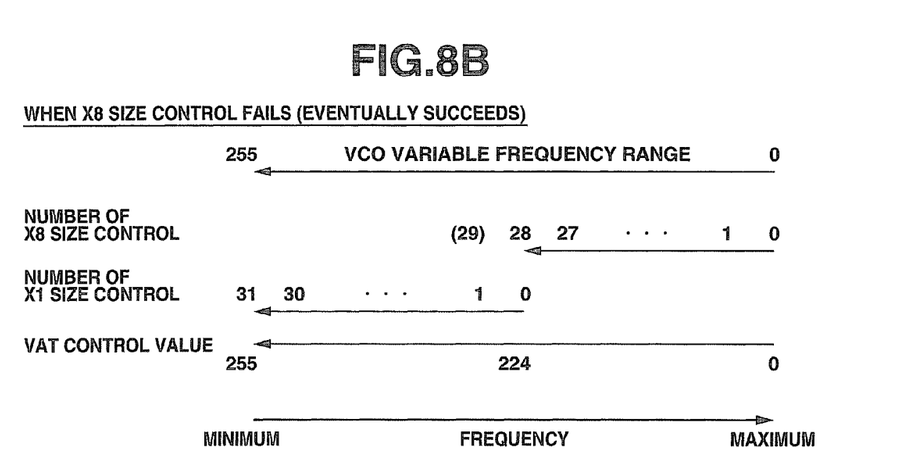
FIG. 8B is a diagram to show the operation when ×8 size control fails thereafter eventually succeeding.

FIG. 7 is a diagram to show another example of the control concept of tuning capacitor, and FIGS. 8A and 8B are diagrams to illustrate the control operation of FIG. 7.

In FIG. 7, a VAT circuit 6 is connected with 28 coarse adjustment capacitors of ×8 size respectively by use of 28 control lines r1 to r28, and with 31 fine adjustment capacitors of ×1 size respectively by use of 31 control lines u1 to u31. The 8 fine adjustment capacitors encircled by a solid line frame 50 out of the 31 fine adjustment capacitors are also configured to be controllable as one coarse adjustment capacitor at the time of coarse adjustment. That is, the 8 fine adjustment capacitors encircled by the solid line frame 50 are separately controllable by each of the 8 control lines as a fine adjustment capacitor of ×1 size at the time of fine adjustment and are also controllable by use of one control line r29 as one coarse adjustment capacitor of ×8 size at the time of coarse adjustment. Note that although in FIG. 7, a set of 8 fine adjustment capacitors which are controllable by use of one control line r29 as a coarse adjustment capacitor of ×8 size are shown, it may be configured such that several sets are formed, with each set including 8 of the other 23 fine adjustment capacitors, so as to be controllable as a coarse adjustment capacitor of ×8 size by use of one control line for each set.

Meanwhile, in a semiconductor integrated circuit which uses such tuning capacitors, as the number of tuning capacitors to be turned on increases, the oscillation frequency of the VCO 4 (see FIGS. 2 and 3) decreases. However, in a digital PLL circuit operation, if an event occurs in which frequency suddenly jumps in increasing direction when it is supposed to decrease in a stepwise manner, a phenomenon called a cycle slip may occur in which the capacitors which have been turned on are initialized all at once to be turned off (one cycle of period is turned). Such a cycle slip is caused by that the VCO oscillation output is delayed too much with respect to the reference clock thereby increasing the phase difference, and other factors. That is, a cycle slip, which occurs when an attempt is made to control the oscillation frequency at an uncontrollable point such as one beyond the frequency variable range of VCO, is a phenomenon which is caused by the event where even though an attempt is made to decrease frequency so as to match the phase of the oscillation output of the VCO with respect to the reference clock, since the range of frequency control is exceeded, the frequency cannot be decreased and one cycle of period is turned.

The frequency range which can be actually controlled is, in the example of FIG. 7, limited to only the range equivalent to 28 capacitors of ×8 size and the range equivalent to 31 capacitors of ×1 size, if the control of 8 fine adjustment capacitors of ×1 size, which are shown in the solid line frame 50, as a capacitor of ×8 size is not taken into account. In a two-step frequency control of ×8 and ×1 sizes, if a control of ×8 size and a control of ×1 size are performed in succession, since there is a variable range of frequency for each size, a cycle slip will occur when an attempt is made to perform a control beyond the variable range for the control of each size.

Therefore, in a two-step frequency control of ×8 and ×1 sizes, if the control of the 8 fine adjustment capacitors of ×1 size, which are shown in the solid line frame 50, as an ×8 size is not taken into account, control failure will occur in the vicinity of an end of each frequency variable range of ×8 and ×1 sizes. To be more specific, in an example of control operation of FIGS. 8A and 8B to be described next, when an attempt is made to perform a control beyond terminal end steps 224 and 255 of each of the frequency variable ranges of ×8 and ×1 sizes in the course of changing frequency in the direction from control step 0 to control step 255 of frequency variable ranges, or in the direction of decreasing frequency, the possibility of the occurrence of control failure will be maximized at 8 steps of the 28th of 28 frequency variable ranges of ×8 size, and at one step of the 31st of 31 frequency variable ranges of ×1 size.

Next, the control operation of the tuning capacitors in the embodiment of the present invention shown in FIG. 7 will be described with reference to FIGS. 8A and 8B. FIG. 8A shows the operation when an ×8 size control succeeds, and FIG. 8B shows the operation when an ×8 size control fails and thereafter eventually succeeds.

The control operation described herein relating to FIG. 7 can be realized as a countermeasure to avoid control failure in the 8 steps of the 28th of the above described coarse adjustment capacitors of ×8 size. In order for that, arrangement is made such that n fine adjustment capacitors can be controlled as one coarse adjustment capacitor at the time of coarse adjustment. Here, description will be made on the case of n=8 in accordance with FIG. 7.

In FIGS. 8A and 8B, the VCO frequency variable range (which is determined by the number of turning capacitors to be controlled) shown in the lateral direction is represent as a control operation in 8 bits, that is, 256 steps of 0 to 255 of frequency range, for example, 2 GHz to 4 GHz, through the performance of the on/off control of 59 tuning capacitors including 28 coarse adjustment capacitors of ×8 size (where 8 fine adjustment capacitors of ×1 size shown by reference number 50 can also function as one coarse adjustment capacitor) and 31 fine adjustment capacitors of ×1 size.

In FIGS. 8A and 8B, it is configured such that one more coarse adjustment capacitor can be added to 28 coarse adjustment capacitors of ×8 size at the time of coarse adjustment as shown in FIG. 7. This additional one coarse adjustment capacitor is obtained as the result of that the 8 fine adjustment capacitors shown by the solid line frame 50 of 31 fine adjustment capacitors of ×1 size are made controllable also as one coarse adjustment capacitor by use of one coarse adjustment control line r29 by the VAT circuit 6.

It is configured that 28 plus 1, that is, 29 coarse adjustment capacitors are controllable at the time of coarse adjustment, and 31 fine adjustment capacitors are controllable at the time of fine adjustment.

The procedure that a state of all of the 59 tuning capacitors (which are equivalent to 255 unit capacitors) being in an off-state (VCO oscillation frequency is for example 4 GHz) is shifted to a state of all of the 59 tuning capacitors being in an on-state (VCO oscillation frequency is for example 2 GHz) is shown.

FIG. 8A is a diagram to show when an ×8 size control succeeds, and FIG. 8B is a diagram to show when an ×8 size control fails (but, the control failure is avoided by 8 capacitors of ×1 size).

First, the VCO oscillation frequency starts to be decreased from a maximum of 4 GHz by successively turning on the 28 coarse adjustment capacitors of ×8 size. In the case in which the targeted oscillation frequency is a frequency of 2 GHz, when an instruction of coarse adjustment is issued from a control part not shown, the VAT circuit 6 can successively turn on 28 coarse adjustment capacitors of ×8 size by use of 29 coarse adjustment control lines r1 to r29 and further turn on up to the (28+1)th thereof which is extended as a region in which coarse adjustment is possible.

Here, when the ×8 size control succeeds, as shown in FIG. 8A, the coarse adjustment capacitors of ×8 size can be turned on up to the 29th thereof. Then, after transition to fine adjustment, 31 fine adjustment capacitors of ×1 size are separately controlled to be turned on starting from the first up to the 31st thereof. On the other hand, when the ×8 size control fails, as shown in FIG. 8B, in the case in which the 28 coarse adjustment capacitors of ×8 size are turned on up to the 28th thereof, and the 29th coarse adjustment capacitor (=8 fine adjustment capacitors of ×1 size) indicated by reference numeral 50 cannot be turned on due to a control error (this is because an attempt is being made to perform a control beyond the frequency variable range by the 29 coarse adjustment capacitors in which coarse adjustment is possible), 8 fine adjustment capacitors, which have been used for coarse adjustment at the time of coarse adjustment, can be separately turned on as a fine adjustment capacitor at the next time of fine adjustment.

That is, the 29th coarse adjustment capacitor of ×8 size (=8 fine adjustment capacitors of ×1 size) is regarded as a control failure, and the control of the next 31 fine adjustment capacitors of ×1 size is entered. Then, in the control of the 31 fine adjustment capacitors of ×1 size, since the 31 fine adjustment capacitors of ×1 size including 8 fine adjustment capacitors of ×1 size which have been used at the time of coarse adjustment (and the control of which is failed) are controllable using the 31 control lines u1 to u31 at the time fine adjustment, it is possible to control 31 fine adjustment capacitors of ×1 size so as to turn on 31 of them one by one thereby decreasing the oscillation frequency, and to control the oscillation frequency to be set at near the targeted 2 GHz or at 2 GHz.

In this way, even if the control of the coarse adjustment capacitor formed by 8 capacitors of ×1 size has failed, since all of the 28 coarse adjustment capacitors of ×8 size can be turned on without failure and the 8 fine adjustment capacitors of the 31 fine adjustment capacitors, which have been used for coarse adjustment, can be used for frequency control again as a use for fine adjustment, it is possible to avoid a failure of ×8 size control and to effectively utilize the tuning capacitors without increasing the number thereof more than necessary.

Note that although description has been made on the case in which control is performed, for example, from 0 to 255 in the VAT control value as so far described, when control is performed, for example, from 0 to 19 in the VAT control value, control is performed to turn on 2 coarse adjustment capacitors of ×8 size, and to turn on next 3 fine adjustment capacitors of ×1 size.

Here, for comparison with the embodiment of the present invention of FIG. 7, and FIGS. 8A and 8B, the control operation of a conventional tuning capacitor will be described with reference to FIG. 10, and FIGS. 11A and 11B.

Figure 10:
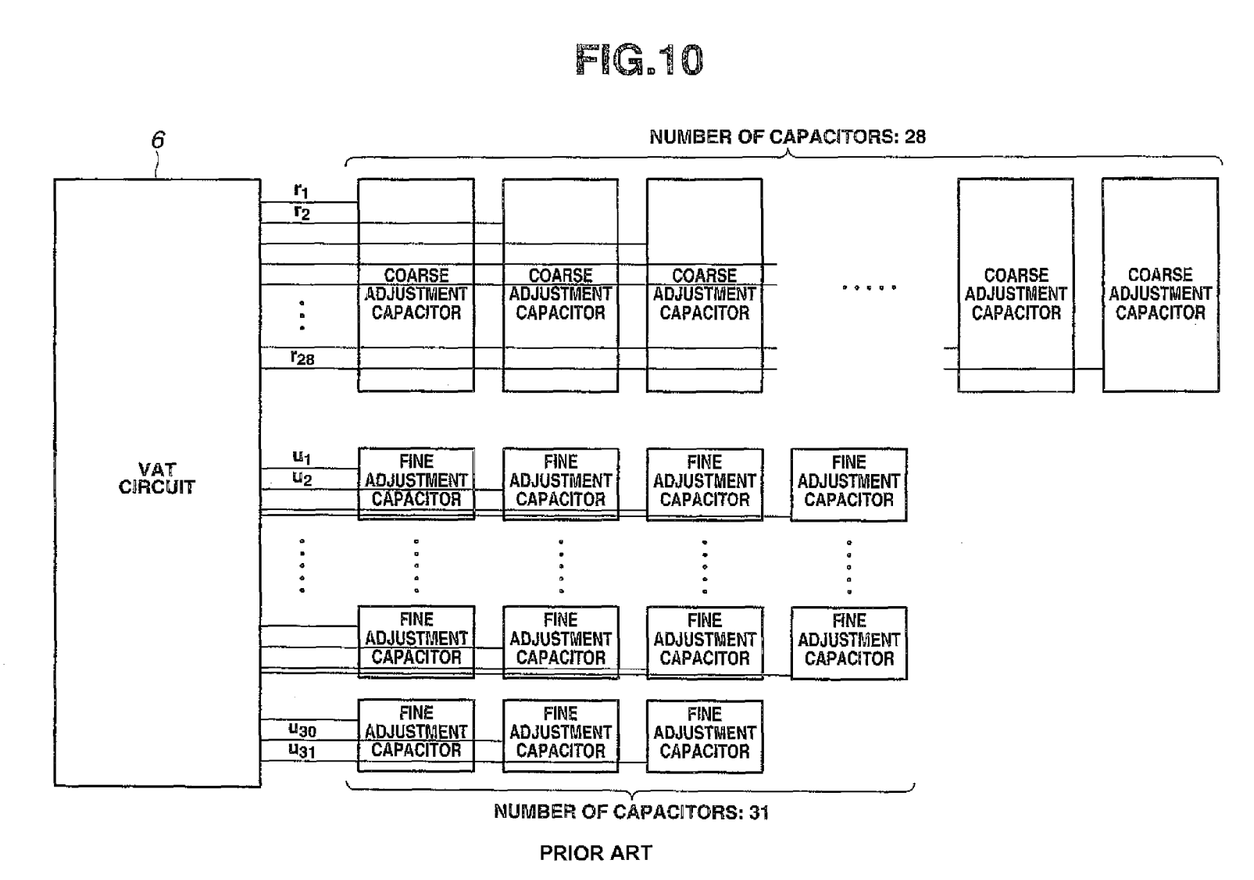
FIG. 10 is a diagram to show the control concept of a conventional tuning capacitor.

FIG. 10 is a diagram to illustrate the control concept of a conventional tuning capacitor, and FIG. 11 is a diagram to illustrate the control operation of FIG. 10.

In FIG. 10, 28 coarse adjustment capacitors of ×8 size are connected to a VAT circuit 6 by use of 28 control lines r1 to r28, respectively, and 31 fine adjustment capacitors of ×1 size are connected by use of 31 control lines u1 to u31, respectively. In FIG. 10, as with the embodiment of the present invention of FIG. 7, it is not configured such that 8 fine adjustment capacitors of the 31 fine adjustment capacitors are controllable as a coarse adjustment capacitor at the time of coarse adjustment.

Figure 11A:
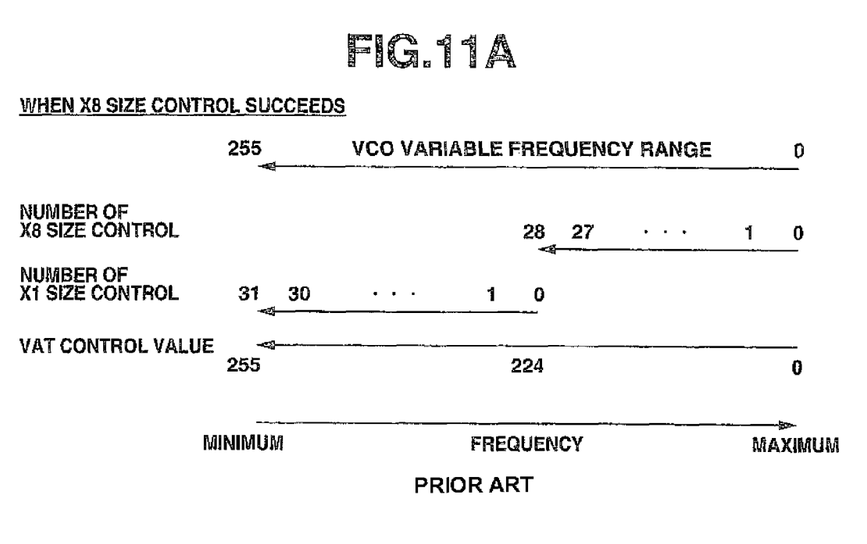
FIG. 11A is a diagram to show the operation when ×8 size control succeeds.
Figure 11B:
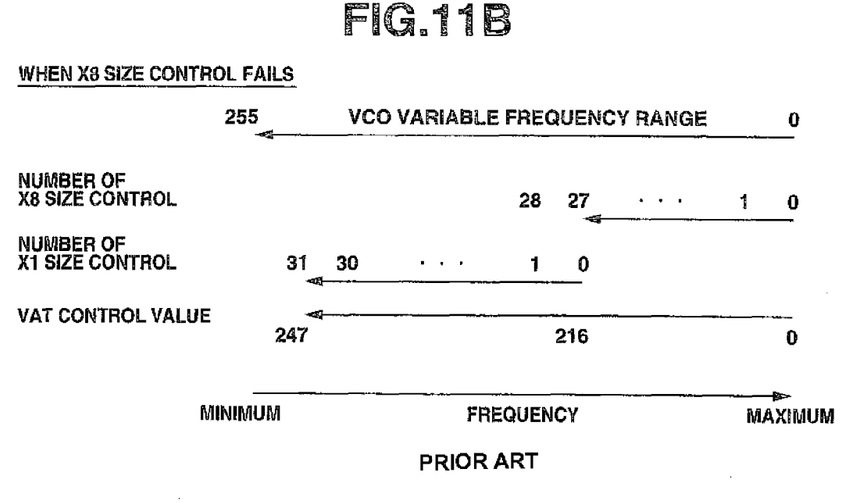
FIG. 11B is a diagram to show the operation when ×8 size control fails.

In FIGS. 11A and 11B, in a two-step frequency control of ×8 and ×1 sizes, referring to the procedure that a state in which all of the 59 tuning capacitors (which are equivalent to 255 units capacitors) are in an off-state (the VCO oscillation frequency in this sate is for example 4 GHz) is shifted to a state in which all of the tuning capacitors are in an on-state (the VCO oscillation frequency in this state is for example 2 GHz); first, 28 coarse adjustment capacitors of ×8 size are successively turned on so that frequency is successively decreased from 4 GHz in a step wise manner. Note that the VCO frequency variable range is determined by the number of tuning capacitors to be controlled.

In a control where a necessary number of the coarse adjustment capacitors of ×8 size to be turned on is less than 28 (equal to or less than 27) (for example, a control where the target frequency is less than about 1.72 GHz), even if one of those capacitors is not turned on due to a control error resulting in a control failure, it is possible to perform control to bring the frequency close to a necessary targeted oscillation frequency by turning on one capacitor before the 28th capacitor (for example, the last (28th) one), or by turning on a necessary number of 31 fine adjustment capacitors of ×1 size.

FIG. 11A is a diagram to show when an ×8 size control succeeds, and FIG. 11B is a diagram to show when an ×8 size control fails.

In the case in which the targeted oscillation frequency is a frequency of 2 GHz, when an ×8 size control succeeds, as shown in FIG. 11A, first 28 coarse adjustment capacitors of ×8 size are successively turned on until the 28th is turned on, thereafter the control of next 31 fine adjustment capacitors of ×1 size is entered so that the 31 fine adjustment capacitors of ×1 size are successively turned on until all of the 31 capacitors are turned on.

However, in the case in which the targeted oscillation frequency is a frequency of 2 GHz, as shown in FIG. 11B, first 28 coarse adjustment capacitors of ×8 size are successively turned on until the 27th thereof is turned on where up to the 28th are supposed to be turned on, and when the 28th cannot be turned on due to a control error, the 28th coarse adjustment capacitor of ×8 size is regarded as a control failure, and the control of next 31 fine adjustment capacitors of ×1 size is entered.

Then, in the control of the 31 fine adjustment capacitors of ×1 size, the 31 fine adjustment capacitors of ×1 size are turned on so that 27 coarse adjustment capacitors of ×8 size excepting one coarse adjustment capacitor the control of which is failed, and 31 fine adjustment capacitors of ×1 size are turned on. However, since the capacitance equivalent to one control-failed capacitor of ×8 size cannot be turned on, when the targeted oscillation frequency is 2 GHz, this target will not be achieved. That is, as shown in "WHEN ×8 SIZE CONTROL FAILS" in FIG. 11B, the frequency will not be decreased even if all the capacitors of ×1 size are turned on. Therefore, the frequency control by the fine adjustment capacitors of ×1 size will also result in a control failure in that the targeted resonance frequency cannot be achieved.

Figure 9:
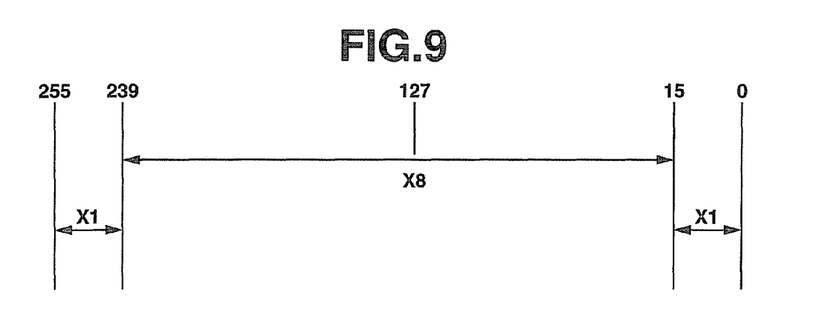
FIG. 9 is a diagram to illustrate another example of the control operation of the tuning capacitor of FIG. 7.

FIG. 9 is a diagram to illustrate the control operation of the tuning capacitor when an initial position (initial value) in the number of the tuning capacitors of FIG. 7 to be controlled is set at a middle position of the variable range of the oscillation frequency of VCO.

Although the control initial value (starting position) at the time of starting the control of the VCO oscillation frequency by the VAT circuit 6 is supposed to be 0 in FIGS. 8A and 8B, it may be set at a middle position of the oscillation frequency variable range of VCO in FIG. 9, that is, the middle position of the control range of the coarse adjustment capacitors of ×8 size (the position of a capacitor number of 127) so that control may be performed in a direction of increasing frequency (right direction in the figure) or in a direction of decreasing frequency (left direction in the figure) from that position. Changing the starting position (initial value) of the control of FIG. 9 means that capacitors of ×8 size and capacitors of ×1 size are sectioned (assigned) as sections for control purpose (not as a capacitor arrangement on the substrate) respectively in both directions of decreasing frequency and increasing frequency, with both sizes of ×1 and ×8 being combined respectively in each direction. Determining the start position in this way makes it possible to avoid control failures caused by a cycle slip which occurs in a coarse adjustment interval as with FIGS. 8A and 8B, even if a two-step control is performed in which 112 coarse adjustment capacitors of ×8 size in the left direction from the start position are turned on/off, and further 16 fine adjustment capacitors of ×1 size are turned on/off. Similarly, even if a two-step control is performed in which 112 coarse adjustment capacitors of ×8 size in the right direction from the start position are turned on/off, and further 16 fine adjustment capacitors of ×1 size are turned on/off, it is possible to avoid control failures caused by a cycle slip which occurs in a coarse adjustment interval as with FIGS. 8A and 8B. However, the control of FIG. 9 is effective when used in a situation where in the control operation to decrease or increase frequency, the frequency control has been finished up to the 127th step, and the control to decrease of increase frequency is restarted from the 127th step.

Note that if the configuration according to the present invention which can avoid a cycle slip is used, a problem regarding control failure caused by a cycle slip will not arise even if a two-step control is performed by setting the start position of the control step at the time of starting the control of the VCO oscillation frequency by the VAT circuit 6 at any position within the oscillation frequency variable range of VCO.

According to the embodiments of the present invention, it becomes possible to provide a digital PLL circuit which can prevent the frequency variable range of the oscillation circuit from being reduced caused by a cycle slip which occurs in a coarse adjustment interval when adjusting the oscillation frequency by changing over between coarse adjustment and fine adjustment, by switching over capacitors of different sizes, and a semiconductor integrated circuit incorporating the digital PLL circuit.

Figure 12:
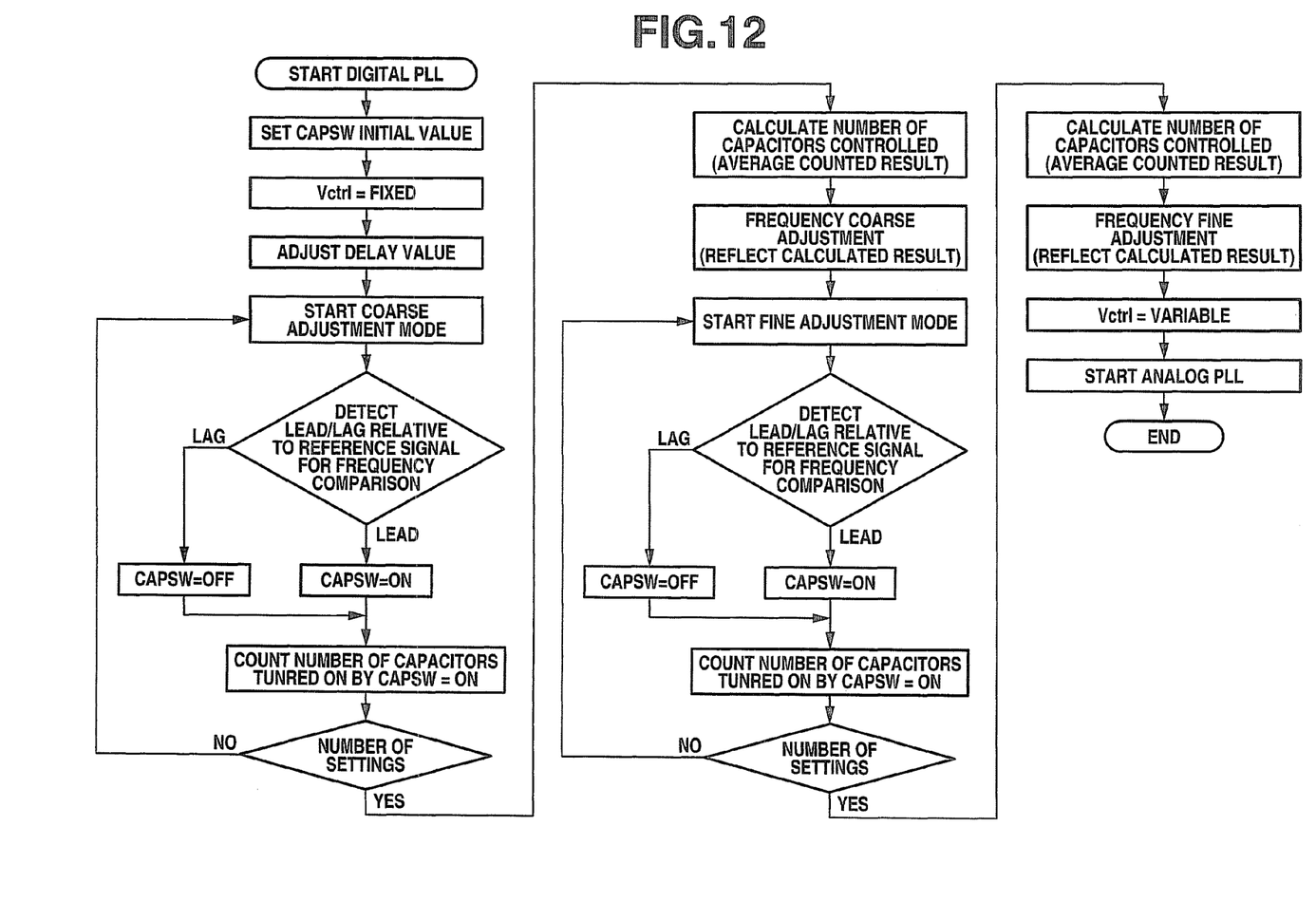
FIG. 12 is a flowchart to illustrate above mentioned operations of a digital PLL and an analog PLL in an embodiment of the present invention.

FIG. 12 shows a flowchart to illustrate operations of a digital PLL and an analog PLL in an embodiment of the present invention. In FIG. 12, CAPSW designates a capacitor selector switch which is turned on and off to increase and decrease, respectively, the capacity.

Having described the embodiments of the invention referring to the accompanying drawings, it should be understood that the present invention is not limited to those precise embodiments and various changes and modifications thereof could be made by one skilled in the art without departing from the spirit or scope of the invention as defined in the appended claims.

What is claimed is:

1. A digital phase-locked loop circuit, comprising:
an oscillation circuit configured to include an inductance element and a capacitance element and to oscillate at a frequency in accordance with an LC value, wherein an oscillation frequency is controlled by changing a number of the capacitance element to be connected in parallel to the inductance element; and
a phase comparator part configured to detect an amount of a phase lead or a phase lag of an output of the oscillation circuit by performing a digital phase comparison of a reference clock and a delayed clock which is successively delayed by a predetermined unit time from the reference clock, with an oscillation output of the oscillation circuit, and based on a detected amount of the phase lead or the phase lag, to control the number of the capacitance element to be connected in parallel to the inductance element thereby controlling the oscillation frequency of the oscillation circuit so as to bring a phase of the output of the oscillation circuit closer to a phase of the reference clock, wherein the capacitance element comprises:
at least one coarse adjustment capacitor configured to have a predetermined capacitance and be connectable in parallel to the inductance element; and
a plurality of fine adjustment capacitors configured to be connectable in parallel to the at least one coarse adjustment capacitor, wherein each fine adjustment capacitor of the plurality of fine adjustment capacitors has a capacitance of 1/n (wherein n is a positive integer) of the capacitance of the at least one coarse adjustment capacitor, and a predetermined number of fine adjustment capacitors of the plurality of fine adjustment capacitors are controlled as one coarse adjustment capacitor at a time of coarse adjustment.

2. The digital phase-locked loop circuit according to claim 1, wherein the predetermined number of fine adjustment capacitors is n.

3. The digital phase-locked loop circuit according to claim 1, wherein during a two-step frequency control by the at least one coarse adjustment capacitor and the plurality of fine adjustment capacitors, a control failure caused by a cycle slip which occurs in the at least one coarse adjustment capacitor in response to control of the at least one coarse adjustment capacitor being shifted to control of the fine adjustment capacitor is recovered by recontrolling, at a time of fine adjustment, the predetermined number of fine adjustment capacitors used at the time of coarse adjustment.

4. The digital phase-locked loop circuit according to claim 1, wherein during a two-step frequency control by the at least one coarse adjustment capacitor and the plurality of fine adjustment capacitors, a control initial value at a time of starting the two-step frequency control is determined at an arbitrary position in an oscillation frequency variable range of the oscillation circuit, and control is performed in a direction to increase the frequency or a direction to decrease the frequency from the arbitrary position.

5. A semiconductor integrated circuit, comprising:
a digital phase-locked loop (PLL) circuit, comprising:
an oscillation circuit configured to include an inductance element and a capacitance element and to oscillate at a frequency in accordance with an LC value, wherein an oscillation frequency is controlled by changing a number of the capacitance element to be connected in parallel to the inductance element; and
a phase comparator part configured to detect an amount of a phase lead or a phase lag of an output of the oscillation circuit by performing a digital phase comparison of a reference clock and a delayed clock which is successively delayed by a predetermined unit time from the reference clock, with an oscillation output of the oscillation circuit, and based on a detected amount of the phase lead or the phase lag, to control the number of the capacitance element to be connected in parallel to the inductance element to control the oscillation frequency of the oscillation circuit so as to bring a phase of the output of the oscillation circuit closer to a phase of the reference clock, wherein the capacitance element comprises:
at least one coarse adjustment capacitor configured to have a predetermined capacitance and to be connectable in parallel to the inductance element; and
a plurality of fine adjustment capacitors configured to be connectable in parallel to the coarse adjustment capacitor, wherein each fine adjustment capacitor of the plurality of fine adjustment capacitors has a capacitance of 1/n (wherein n is a positive integer) of the predetermined capacitance of the coarse adjustment capacitor, and a predetermined number of fine adjustment capacitors of the plurality of fine adjustment capacitors are controlled as one coarse adjustment capacitor at a time of coarse adjustment;

an analog PLL circuit, comprising:
- a variable capacitance element configured to be connected in parallel to the inductance element of the oscillation circuit; and
- a second phase comparator part configured to perform an analog phase comparison between the oscillation output of the oscillation circuit and the reference clock and, based on a result of the analog phase comparison, to control the variable capacitance element thereby controlling the oscillation frequency of the oscillation circuit such that a phase of the oscillation output of the oscillation circuit coincides with the phase of the reference clock; and change-over means configured to perform a changeover to the analog PLL circuit to bring about a lock-up by the analog PLL circuit in response to the digital PLL circuit being locked up at an oscillation frequency of a predetermined initial value.

* * * * *